United States Patent
Chou et al.

(10) Patent No.: US 11,819,976 B2
(45) Date of Patent: Nov. 21, 2023

(54) SPRAY SYSTEM FOR SLURRY REDUCTION DURING CHEMICAL MECHANICAL POLISHING (CMP)

(71) Applicant: Applied Materials, Inc., Santa Clara, CA (US)

(72) Inventors: Chih Chung Chou, San Jose, CA (US); Anand Nilakantan Iyer, Cupertino, CA (US); Ekaterina Mikhaylichenko, San Jose, CA (US); Christopher Heung-Gyun Lee, San Jose, CA (US); Erik Rondum, San Ramon, CA (US); Tiffany Yu-Nung Cheung, Alameda, CA (US); Shou-Sung Chang, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 14 days.

(21) Appl. No.: 17/359,255

(22) Filed: Jun. 25, 2021

(65) Prior Publication Data
US 2022/0410336 A1 Dec. 29, 2022

(51) Int. Cl.
*H01L 21/306* (2006.01)
*B24B 37/04* (2012.01)

(52) U.S. Cl.
CPC ...... *B24B 37/042* (2013.01); *H01L 21/30625* (2013.01)

(58) Field of Classification Search
CPC .................. B24B 37/042; H01L 21/30625
(Continued)

(56) References Cited

U.S. PATENT DOCUMENTS 6,398,627 B1 * 6/2002 Chiou .................... B24B 57/02
451/72
6,679,765 B2 1/2004 Tung et al.
(Continued)

FOREIGN PATENT DOCUMENTS

JP 09186118 A * 7/1997 ............. B24B 37/04
JP H1034535 A * 2/1998 ........... H10L 21/304
(Continued)

OTHER PUBLICATIONS

International Search Report and Written Opinion dated Oct. 12, 2022 for Application No. PCT/US2022/033476.

*Primary Examiner* — Duy Vu N Deo
(74) *Attorney, Agent, or Firm* — PATTERSON & SHERIDAN, LLP; Marcus Hammack

(57) ABSTRACT

Methods and apparatuses for dispensing polishing fluids onto a polishing pad within a chemical mechanical polishing (CMP) system are disclosed herein. In particular, embodiments herein relate to a CMP polishing method including urging a substrate against a surface of a pad of a polishing system using a carrier assembly. A fluid is dispensed onto the pad from a fluid delivery assembly at a variable flow rate and a first flow rate of the variable flow rate is pulsed at a frequency and a duty cycle. The frequency refers to a number of pulses of the fluid at the first flow rate per rotation of the pad. The term duty cycle refers to a percentage of the pad exposed to fluid per rotation of the pad. The carrier assembly is translated across a surface of the pad while rotating the carrier assembly about a rotational axis.

19 Claims, 14 Drawing Sheets

(58) Field of Classification Search
USPC .................................................. 438/690–693
See application file for complete search history.

(56) References Cited

U.S. PATENT DOCUMENTS

| | | | |
|---|---|---|---|
| 7,601,643 B1* | 10/2009 | May | H01L 21/3212 |
| | | | 438/692 |
| 2006/0105678 A1* | 5/2006 | Kohama | B24B 37/04 |
| | | | 451/5 |
| 2020/0171621 A1* | 6/2020 | Yamazaki | B24B 37/34 |

FOREIGN PATENT DOCUMENTS

| | | | | |
|---|---|---|---|---|
| JP | 2005103696 A | | 4/2005 | |
| JP | 2010042487 A | | 2/2010 | |
| KR | 20200115854 A | | 10/2020 | |
| WO | WO-2010005702 A1 | * | 1/2010 | ............. B24B 37/12 |

* cited by examiner

SPRAY SYSTEM FOR SLURRY REDUCTION DURING CHEMICAL MECHANICAL POLISHING (CMP)

BACKGROUND

Field

Embodiments of the present disclosure generally relate to chemical mechanical polishing (CMP) systems and methods used in the manufacturing of semiconductor devices. In particular, embodiments herein relate to systems and methods for uniformly dispensing polishing fluid using a reduced amount of polishing fluid.

Description of the Related Art

Chemical mechanical polishing (CMP) is commonly used in the manufacturing of semiconductor devices to planarize or polish a layer of material deposited on a substrate surface. In a typical CMP process, a substrate is retained in a substrate carrier which presses the backside of the substrate towards a rotating polishing pad in the presence of a polishing fluid. Generally, the polishing fluid comprises an aqueous solution of one or more chemical constituents and nanoscale abrasive particles suspended in the aqueous solution. Material is removed across the material layer surface of the substrate in contact with the polishing pad through a combination of chemical and mechanical activity which is provided by the polishing fluid and the relative motion of the substrate and the polishing pad.

The polishing fluid is generally dispensed onto the polishing pad from a first arm towards the center of the polishing pad so that the polishing fluid migrates towards an outer edge of the polishing pad as the polishing pad rotates. The polishing fluid often accumulates near the edge of the substrate underneath the substrate carrier. The accumulation of the polishing fluid near the substrate edge results in uneven substrate material removal profiles and either increased or decreased removal rates near the edge. Typical fluid dispensing slurry tubes or slurry delivery hardware do not uniformly dispense fluids at low flow rates. As a result, continuous fluid at high flow rates are used which wastes fluid during operation.

Accordingly, there is a need in the industry for systems and methods for uniformly distributing polishing fluid with reduced fluid consumption with minimal impact on the pad lifetime.

SUMMARY

In some embodiments, a method of polishing a substrate is provided including urging a substrate against a surface of a pad of a polishing system using a carrier assembly and dispensing fluid onto the pad from a fluid delivery assembly at a variable flow rate. A first flow rate of the variable flow rate is pulsed at a frequency and a duty cycle, wherein the frequency is a number of pulses of the fluid at the first flow rate per rotation of the pad and the duty cycle is percentage of the pad exposed to fluid per rotation of the pad. The method includes translating the carrier assembly across a surface of the pad while rotating the carrier assembly about a rotational axis.

In some embodiments, an apparatus for processing a substrate is provided. The apparatus including a pad disposed on a platen. The pad has a pad radius and a central axis from which the pad radius extends. A carrier assembly is configured to be disposed on a surface of the pad and having a carrier radius that extends from a rotational axis of the carrier assembly. A fluid delivery assembly is provided including one or more nozzles, each nozzle coupled to a fast actuating valve.

In some embodiments, a fluid delivery assembly is provided including an arm, a plate coupled to the arm, and one or more fan jet nozzles configured to dispense pressurized fluid having a flat fan jet shape. Each nozzle is coupled to a portion of the plate and to a fast actuating valve. A spacing provided between nozzles is adjustable along a length of the plate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
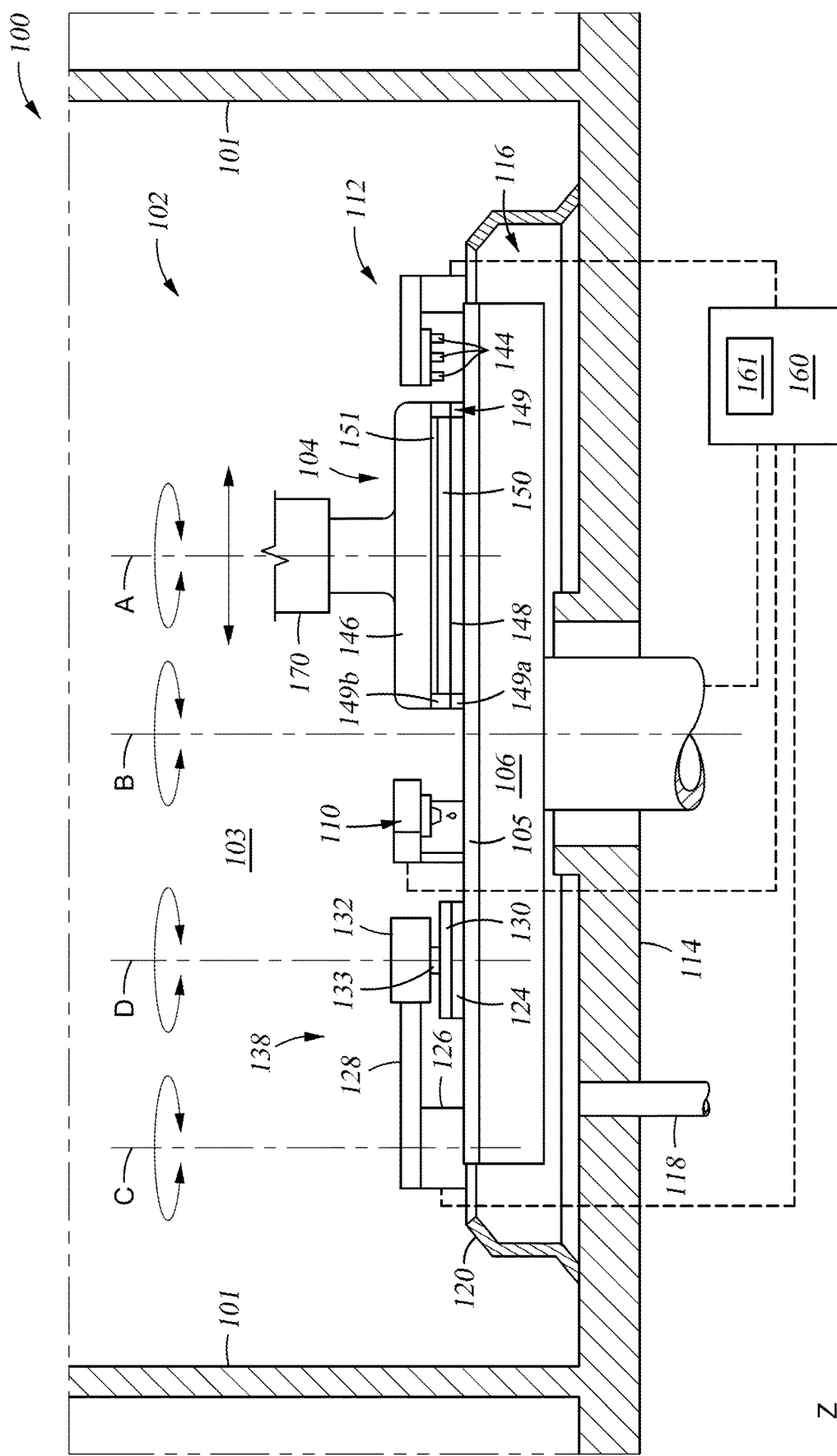
FIG. 1 is a schematic side view of a polishing system that may be used with the methods of the present disclosure, according to some embodiments.

Embodiments of the present disclosure generally relate to apparatuses and methods for reducing polishing fluid usage in chemical mechanical polishing (CMP) processing by controlling delivery of polishing fluids onto a polishing pad within a CMP system. The polishing fluids are delivered using one more or more fluid nozzles with variable fluid flow rates, such as on and off pulsing. The fluid nozzles are positioned on the polishing system proximate to a leading edge of a translational path of a rotating carrier assembly such that a substrate disposed on the rotating carrier assembly passes over the fluid shortly after the fluid is dispensed. Fluid nozzles are positioned on an assembly along different radial positions of the assembly and are capable of dispensing flat jet streams of polishing fluids to different zones of a polishing pad. Each of the flat jet streams are controlled independently, such as by controlling a duty cycle of pulsing and frequency of dispensing. As used herein, the term "duty cycle" refers to a percentage of the pad exposed to fluid from a fluid nozzle per full rotation of the pad, and the term "frequency" refers to the number of times a fluid nozzle is switched to an open position per full rotation of the pad.

Conventional fluid dispensing systems use continuous flow rates of polishing fluid dispensed from nozzles onto the polishing pad. Continuous flow of polishing fluids results in a portion of the polishing fluid being lost before the substrate reaches the fluid. Moreover, conventional fluid dispensing systems typically use a single nozzle for dispensing fluid. As a result, large amounts of fluid is needed to enable desired fluid accumulation at certain regions of the substrate. In contrast, the apparatus and method provided herein, enables control of fluid dispensing at different regions of the substrate and pulses the fluid so that less fluid is dispensed during operation. Depending on the polishing fluid chemistry and the application, a reduction of greater than 10% of polishing fluid is achieved, such as a reduction of about 30% to about 50% relative to conventional processes. In some conventional fluid dispensing processes, conventional systems dispense polishing fluid at a rate of 200 mL/min or greater. In contrast, apparatuses and methods described herein dispense polishing fluid at about 80 mL/min to about 190 mL/min, such as about 100 mL/min to about 140 mL/min. The reduced rate is possible by pulsing one or more nozzles directed at different regions of the pad.

A typical polishing fluid used in CMP processes includes an aqueous solution of one or more chemical constituents along with nanoscale abrasive particles suspended in the aqueous solution. The increase or decrease in fluid accumulation and fluid component concentration, such as polishing fluid accumulation and the concentration of the abrasive particles and/or chemical composition of the polishing fluid, near the edge of the substrate during CMP processing can accelerate or decelerate the removal rate near the edge of the substrate.

It has been found that using low flow rates below 200 mL/min for conventional systems compromises removal rate or increases occurrences of defects. In contrast, the processes and apparatuses provided herein enable a reduction in fluid flow and an increase in uniform coverage of the pad surface without compromising removal rate and/or without increasing occurrences of defects. In some embodiments, which can be combined with other embodiments described herein, a plurality of nozzles are positioned on an assembly and directed as flat jet sprays aligned radially inward relative to a center of the pad. In some configurations, the process takes into account the geometry of the pad and/or platen and how the fluid travels along the polishing pad and under the substrate carrier and substrate to deliver fluid to desired portions of the substrate, such as the edges of the substrate, without substantially impacting the concentration and/or flow of fluid across other regions of the substrate, such as the center of the substrate. In some embodiments, which can be combined with other embodiments described herein, the substrate carrier rotation speed and the platen rotation speeds vary. The rotation speed of both the platen and also the substrate carrier assembly impact the effect the polishing fluids have on the polishing process. This may alter process results and be used to obtain predetermined results.

In some embodiments, which can be combined with other embodiments described herein, the substrate carrier is rotated at speed of about 30 revolutions per minute (rpm) to about 165 rpm, such as about 50 rpm to about 150 rpm. In some embodiments, which can be combined with other embodiments described herein, the substrate carrier assembly may be held still while the platen rotates. The platen may rotate at a speed of about 20 rpm to about 150 rpm, such as about 35 rpm to about 120 rpm.

In some embodiments the substrate carrier and the platen may rotate at either higher or lower rotational speed ranges than those listed herein and may be adjusted to accommodate different polishing applications. While in some embodiments both the substrate carrier and the platen are rotated at a similar speed, in other embodiments, the substrate carrier and the platen are rotated at dissimilar speeds, such that either the substrate carrier is rotating faster than the platen or the platen is rotating faster than the substrate carrier. In embodiments disclosed herein, the edge of the substrate is defined as the outermost 10 mm of the substrate, such that the center portion of the substrate is the innermost 140 mm of the radius for a 300 mm diameter substrate.

FIG. 1 is a schematic side view of a polishing system 100 that may be used with the methods provided herein, according to some embodiments. The polishing system 100 includes a frame (not shown) and a plurality of panels 101 which define a substrate processing environment 103. The polishing system 100 includes a plurality of polishing stations 102 (one shown) and a plurality of substrate carrier assemblies 104 (one shown) which are disposed within the substrate processing environment 103.

As shown in FIG. 1, a polishing station 102 includes a platen 106, a polishing pad 105 mounted on the platen 106 and secured thereto, a pad conditioner assembly 138 for cleaning and/or rejuvenating the polishing pad, a fluid delivery assembly 112 for dispensing one or more fluids (e.g., a polishing fluid and/or water) onto the polishing pad 105, a rotating substrate carrier assembly 104 configured to be disposed on the polishing pad 105, and a controller 160. In some embodiments, the polishing station 102 further includes a secondary fluid delivery assembly 110 for dispensing one or more fluids (e.g., a polishing fluid and/or water) onto the polishing pad 105 in addition to the reduced fluid delivery assembly 112. In some embodiments, the polishing station 102 includes a single reduced fluid delivery assembly 112. The controller 160 is connected to each of the platen 106, the pad conditioner assembly 138, and the fluid delivery assembly 112. Here, the platen 106 is disposed above a base plate 114 and is circumscribed by a platen shield 120 (both shown in cross section) which collectively define a drainage basin 116. The drainage basin 116 is used to collect fluids spun radially outward from the platen 106 and to drain the fluids through a drain 118 in fluid communication therewith.

The pad conditioner assembly 138 is used to clean and/or rejuvenate the polishing pad 105 by sweeping polishing byproducts therefrom, such as with a brush (not shown), and/or by abrading the polishing pad 105 by urging an abrasive pad conditioning disk 124 (e.g., a diamond impregnated disk) there against. Pad conditioning operations may be done between polishing substrates, i.e., ex-situ conditioning, concurrently with polishing a substrate, i.e., in-situ conditioning, or both.

Here, the pad conditioner assembly 138 includes a first conditioner actuator 126 disposed on the base plate 114, a conditioner arm 128 coupled to the first conditioner actuator 126, and a conditioner mounting plate 130 having the conditioner disk 124 fixedly coupled thereto. A first end of the conditioner arm 128 is coupled to the first conditioner actuator 126, and the mounting plate 130 is coupled to a second end of the conditioner arm 128 that is distal from the first end. The first conditioner actuator 126 is used to sweep the conditioner arm 128, and thus the conditioner disk 124, about an axis C so that the conditioner disk 124 oscillates between an inner radius of the polishing pad 105 and an outer radius of the polishing pad 105 while the polishing pad 105 rotates there beneath. In some embodiments, the pad conditioner assembly 138 further includes a second conditioner actuator 132 disposed at, and coupled to, the second end of the conditioner arm 128, the second conditioner actuator 132 is used to rotate the conditioner disk 124 about an axis D. Typically, the mounting plate 130 is coupled to the second conditioner actuator 132 using a shaft 133 disposed there between.

Generally, the rotating substrate carrier assembly 104 is swept back and forth across a desired region of the platen 106 while the polishing pad 105, rotates about a platen axis B there beneath. In some configurations, the substrate carrier assembly 104 rotates and moves in a radial direction relative to the polishing pad 105 and platen 106, such that the substrate carrier assembly 104 can move along the radius of the rotating polishing pad 105. In other configurations, the substrate carrier assembly 104 rotates and moves in an arcuate path relative to the center of the CMP polishing system (not shown), and thus in a non-radial direction across the polishing pad 105 and platen 106. The substrate carrier assembly 104 is rotated and moved using a first actuator 170. The first actuator 170 is connected to the substrate carrier assembly 104 at a shaft and may include a track or a set of tracks (not shown) to enable movement of the substrate carrier assembly 104 in either of a radial or an arcuate path across the surface of the polishing pad 105.

The substrate carrier assembly 104 features a carrier head 146, a carrier ring assembly 149 coupled to the carrier head 146, and a flexible membrane 150 disposed radially inward of the carrier ring assembly 149 to retain and urge the substrate 148 against the polishing pad 105 during processing. The carrier ring assembly 149 includes a lower annular portion and an upper annular portion, such as a substrate retaining ring 149*a* and a backing ring 149*b* respectively. The substrate retaining ring 149*a* is typically formed of a polymer which is bonded to the backing ring 149*b* using a bonding layer (not shown) disposed therein. The backing ring 149*b* is formed of a rigid material, such as a metal or ceramic, and is secured to the carrier head 146 using a plurality of fasteners (not shown). Examples of suitable materials used to form the substrate retaining ring 149*a* and the backing ring 149*b* respectively include any one or combination of the polishing fluid chemical resistant polymers, metals, and/or ceramics described herein. The flexible membrane 150 is typically coupled to the carrier head 146 using one or more annular membrane clamps to collectively define a volume 151 therewith.

During substrate processing, the substrate retaining ring 149*a* surrounds the substrate 148 to prevent the substrate 148 from slipping from underneath the substrate carrier assembly 104. Typically, the volume 151 is pressurized during the polishing process to cause the flexible membrane 150 to exert a downward force on the substrate 148 while the substrate carrier assembly 104 rotates about the carrier axis A, thus urging the substrate 148 against the polishing pad 105. The carrier axis A may also be referred to herein as a rotational axis about which the substrate carrier assembly 104 is rotated during processing. Before and after polishing, a vacuum is applied to the volume 151 so that the flexible membrane 150 is deflected upwards to create a low pressure pocket between the flexible membrane 150 and the substrate 148, thus vacuum-chucking the substrate 148 to the substrate carrier assembly 104.

The fluid delivery assembly 112 includes one or more delivery nozzles 144. The one or more delivery nozzle 144 is configured to provide a fluid, such as either a polishing fluid or water onto the polishing pad 105 near the leading edge of the substrate carrier assembly 104. In some embodiments, the fluid delivery assembly 112 is coupled to the pad conditioner assembly (as shown in assembly 238 of FIG. 2A-D). In some embodiments, the fluid delivery assembly 112 is separate from and proximate to the pad conditioner assembly (as shown in the pad conditioner assembly 128 and fluid delivery assembly 112 in FIGS. 1, 3A, and 3B).

The controller 160 is connected to each of the platen 106, the pad conditioner assembly 138, the fluid delivery assembly 112, and the substrate carrier assembly 104. In some embodiments, which can be combined with other embodiments described herein, the controller 160 coordinates the rotation of the platen 106 as well as the dispensing of polishing fluid or water onto the polishing pad 105 by the fluid delivery assembly 112. In some implementations, the controller 160 coordinates dispensing of polishing fluid or water onto the polishing pad 105 by the second fluid delivery assembly 110. In some embodiments, which can be combined with other embodiments described herein, the second fluid delivery assembly 110 dispenses cooling fluid onto the polishing pad 105 to reduce the temperature of the polishing pad 105. The controller 160 can increase cooling fluid from the second fluid delivery assembly 110 as the platen rotational speed is reduced. The cooling fluid can be deionized water, nitrogen gas, or a combination thereof. The controller 160 controls the movement of the substrate carrier assembly 104 and may increase or decrease the amount of pressure exerted onto the substrate 148 by the substrate carrier assembly 104. The controller 160 includes or is communicatively coupled to a pulse width modulation control panel (PWM panel) 161. The PWM panel 161 controls each of the delivery nozzles 144 of the fluid delivery assembly 112.

Figure 2A:
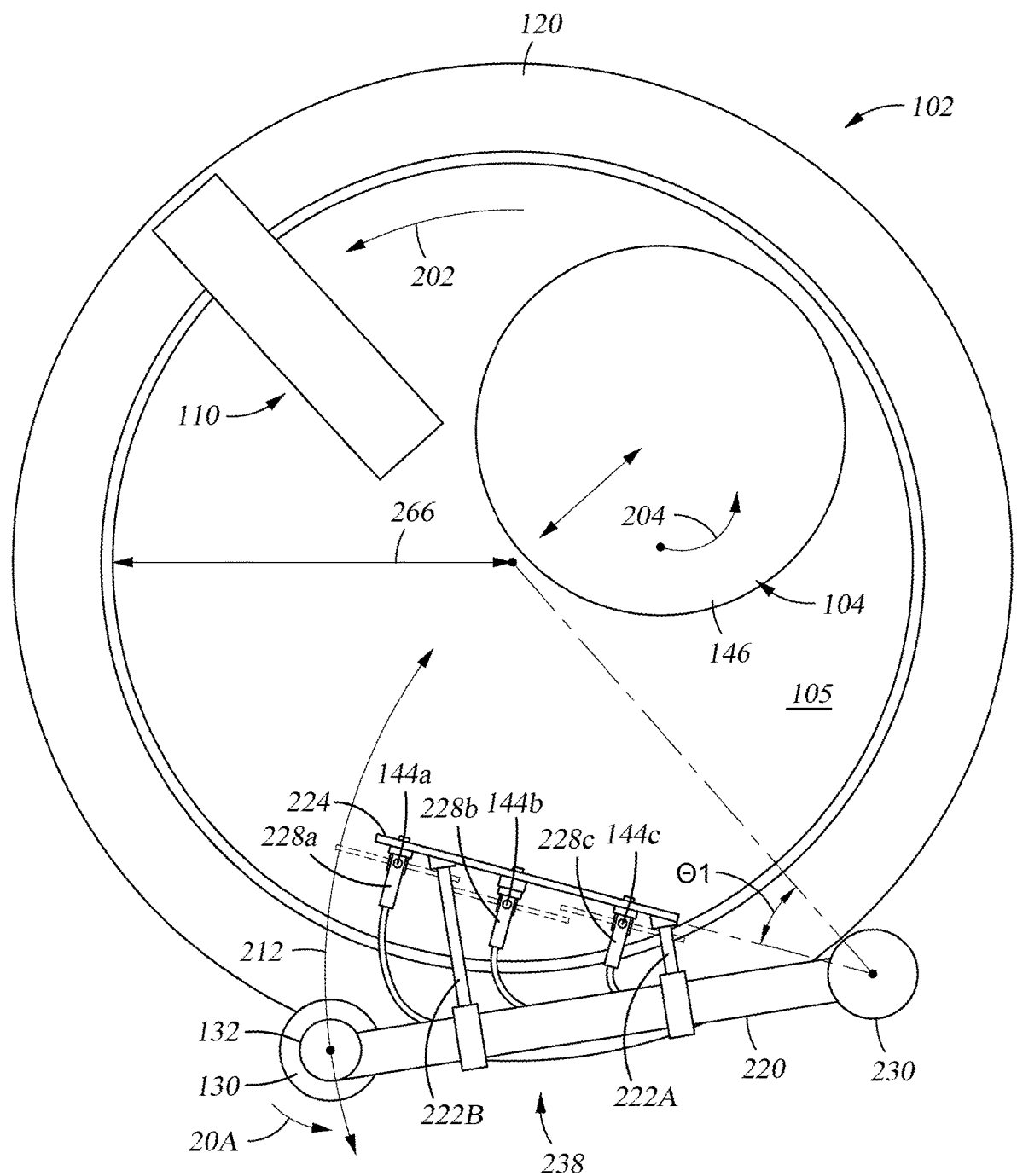
FIG. 2A is a schematic plan view of the polishing system, according to some embodiments.
Figure 2B:
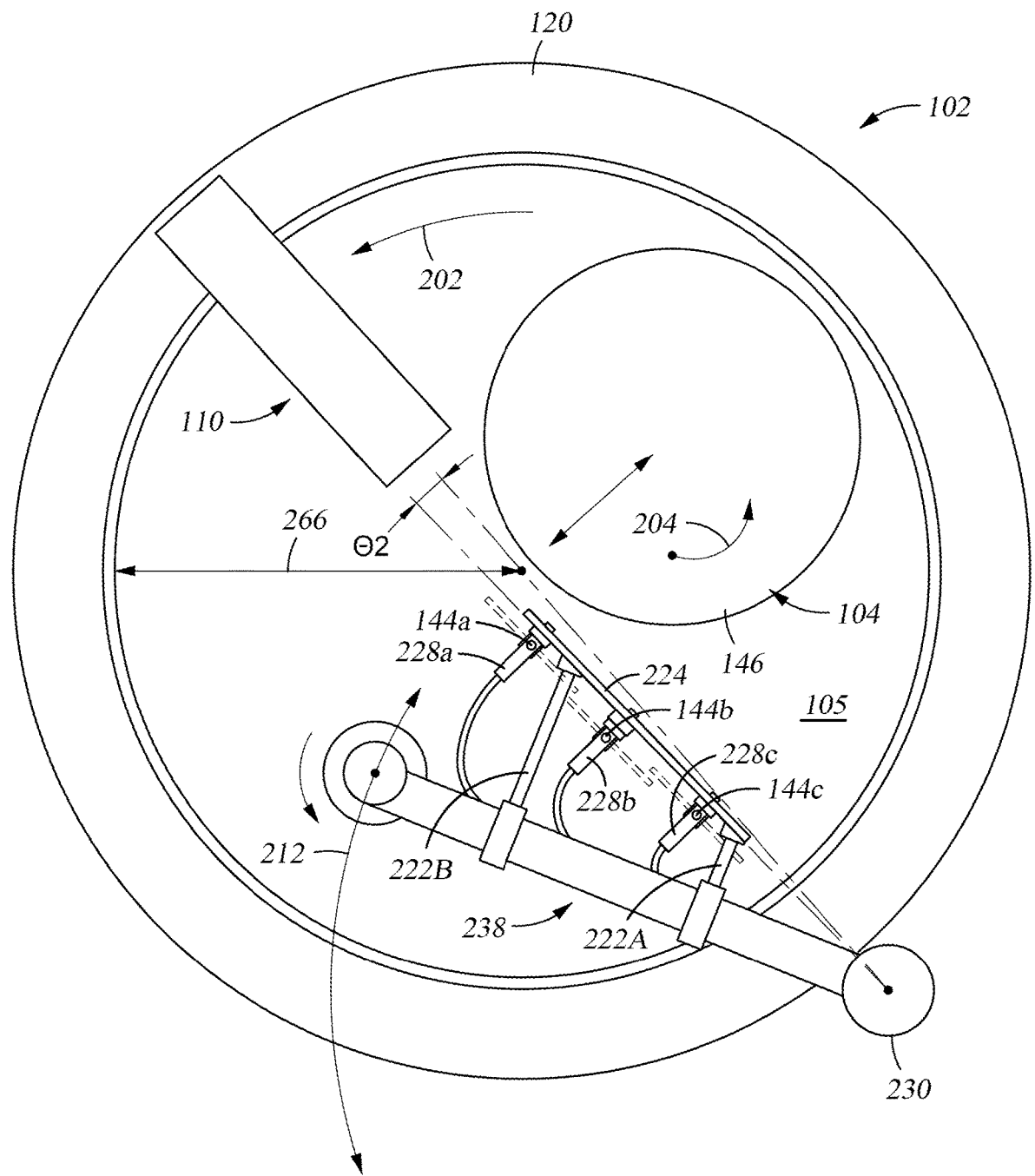
FIG. 2B is a schematic plan view of the polishing system, according to some embodiments.

FIGS. 2A and 2B are schematic plan views of a polishing system similar to the polishing system 100 except the fluid delivery assembly 112 is coupled to the pad conditioner assembly 138 and is together depicted as pad conditioner, fluid delivery assembly 238, according to some embodiments.

The pad conditioner, fluid delivery assembly 238, the second fluid delivery assembly 110, and the substrate carrier assembly 104 are disposed above the polishing pad 105. In one example, the polishing pad 105 is rotated in a counterclockwise direction 202 by a rotation actuator (not shown) coupled to the platen 106 about the platen axis B (FIG. 1). The conditioner mounting plate 130 and the substrate carrier assembly 104 also typically rotate in a counterclockwise direction 204 when viewed from above. In the embodiment of FIGS. 2A and 2B, each of the polishing pad 105, the conditioner mounting plate 130, and the substrate carrier assembly 104 rotate in the same direction. In some embodiments, the polishing pad 105, the platen 106, the conditioner mounting plate 130, and the substrate carrier assembly 104 rotate in a clockwise direction. In some embodiments, one or more of the polishing pad 105, the platen 106, the conditioner mounting plate 130, and the substrate carrier assembly 104 rotate in a clockwise direction while the other components rotate in a counterclockwise direction. The pad conditioner, fluid delivery assembly 238 includes a movable arm 220 which pivots from fulcrum 230, one or more extenders 222A, 222B coupled to the movable arm 220 and a fluid nozzle plate 224. The movable arm 220 is movable along path 212. The fluid nozzle plate 224 includes one or more jet spray nozzles 144a, 144b, 144c. Each nozzle is coupled to a corresponding fast actuating valve 228a, 228b, 228c, such as solenoid valves. The fast actuating valves 228a, 228b, 228c are controlled by PWM panel 161. Similar to the fluid delivery assembly 138, the PWM panel 161 controls each of the jet spray nozzles 144a, 144b, 144c of the pad conditioner, fluid delivery assembly 238. The conditioner mounting plate 130 is disposed on the distal end of the movable arm 220 opposite the fulcrum 230.

The pad radius 266 of the polishing pad 105 is about 5 inches (127 mm) to about 15 inches (381 mm), such as about 6 inches (152 mm) to about 10 inches (154 mm), such as about 7 inches (178 mm) to about 8 inches (203 mm). As shown in FIGS. 2A and 2B, the pad conditioner, fluid delivery assembly 238 can be movable, such as from a first position depicted in FIG. 2A to a second position depicted in FIG. 2B. In some embodiments, the fluid from the pad conditioner, fluid delivery assembly 238 is dispensed in the second position depicted in FIG. 2B. The fluid is dispensed at least partially during pad conditioning, or when the pad is not being conditioned.

In some embodiments, such as when the fluid delivery assembly 238 is in the first position, at least a portion of the fluid delivery assembly 238 is configured to deliver a fluid at a position that is at least 50% of the pad radius 266 of the polishing pad 105, such as over at least 60% of the pad radius 266 of the polishing pad 105, such as over at least 80% of the pad radius 266. The jet spray nozzles 144a, 144b, 144c are aligned relative to one another, and/or along a length of the nozzle plate 224, such as shown in FIGS. 2A and 2B. The nozzle plate 224 is positioned with a first major surface oriented at an angle θ1 relative to a radius of the pad measured from fulcrum 230. In some embodiments, the length of the nozzle plate 224 is disposed substantially perpendicular, such as about 80 degrees to about 110 degrees to an axis along a radius of the polishing pad 105. In some embodiments, such as when the fluid delivery assembly 238 is in the second position, at least a portion of the fluid delivery assembly 238 is configured to deliver a fluid at a position that is about 40% to about 60% of the pad radius 266. Additionally, or alternatively, at least a portion of the fluid delivery assembly 238 is configured to deliver a fluid at a position that is less than 50% of the pad radius 266, such as about 10% to about 30%. In some embodiments, the fluid delivery assembly 238 is configured to deliver a fluid along the entire pad radius 266. Each nozzle, e.g., 144a, 144b, 144c, corresponds to zones of the polishing pad 105, such as an inner zone, a middle zone, and an outer zone. In some embodiments, a length of the nozzle plate 224 is substantially aligned with the pad radius. The nozzle plate 224 is positioned with a first major surface oriented at an angle θ2 relative to a radius of the pad measured from the fulcrum 230 less than 10 degrees, such as about 0 degrees to 5 degrees. In some embodiments, which can be combined with other embodiments, the nozzle plate 224 position is fixed in the second position during operation. In some embodiments, which can be combined with other embodiments, each of the fluid nozzles 144a, 144b, 144c are about 70 mm to about 120 mm, such as about 80 mm to about 100 mm from the substrate carrier assembly 104. In some embodiments, which can be combined with other embodiments, each of the fluid nozzles 144a, 144b, 144c are about 10 mm to about 50 mm, such as about 20 mm to about 30 mm from the pad.

Figure 2C:
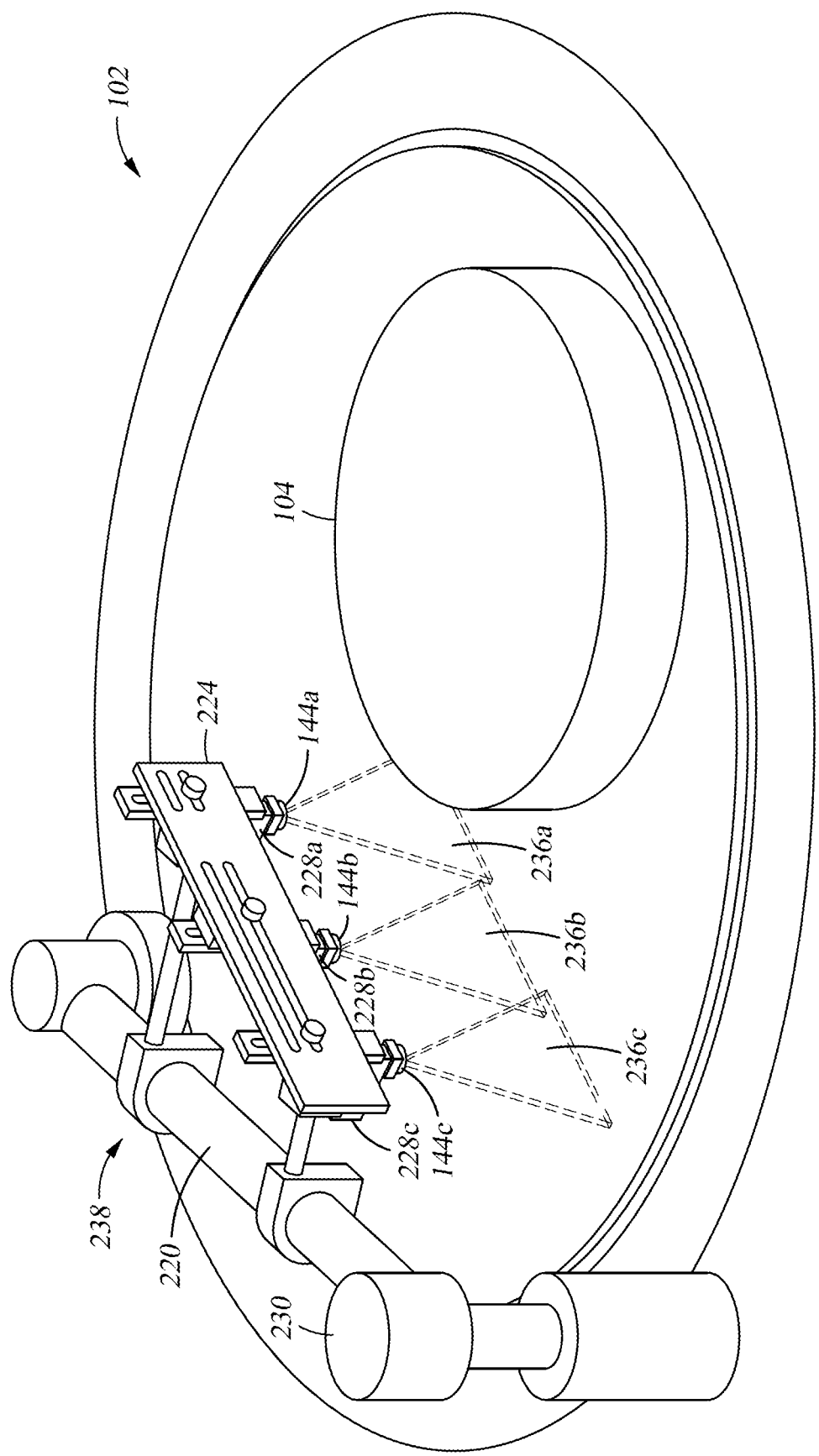
FIG. 2C is a perspective view of the polishing system, according to some embodiments.
Figure 2D:
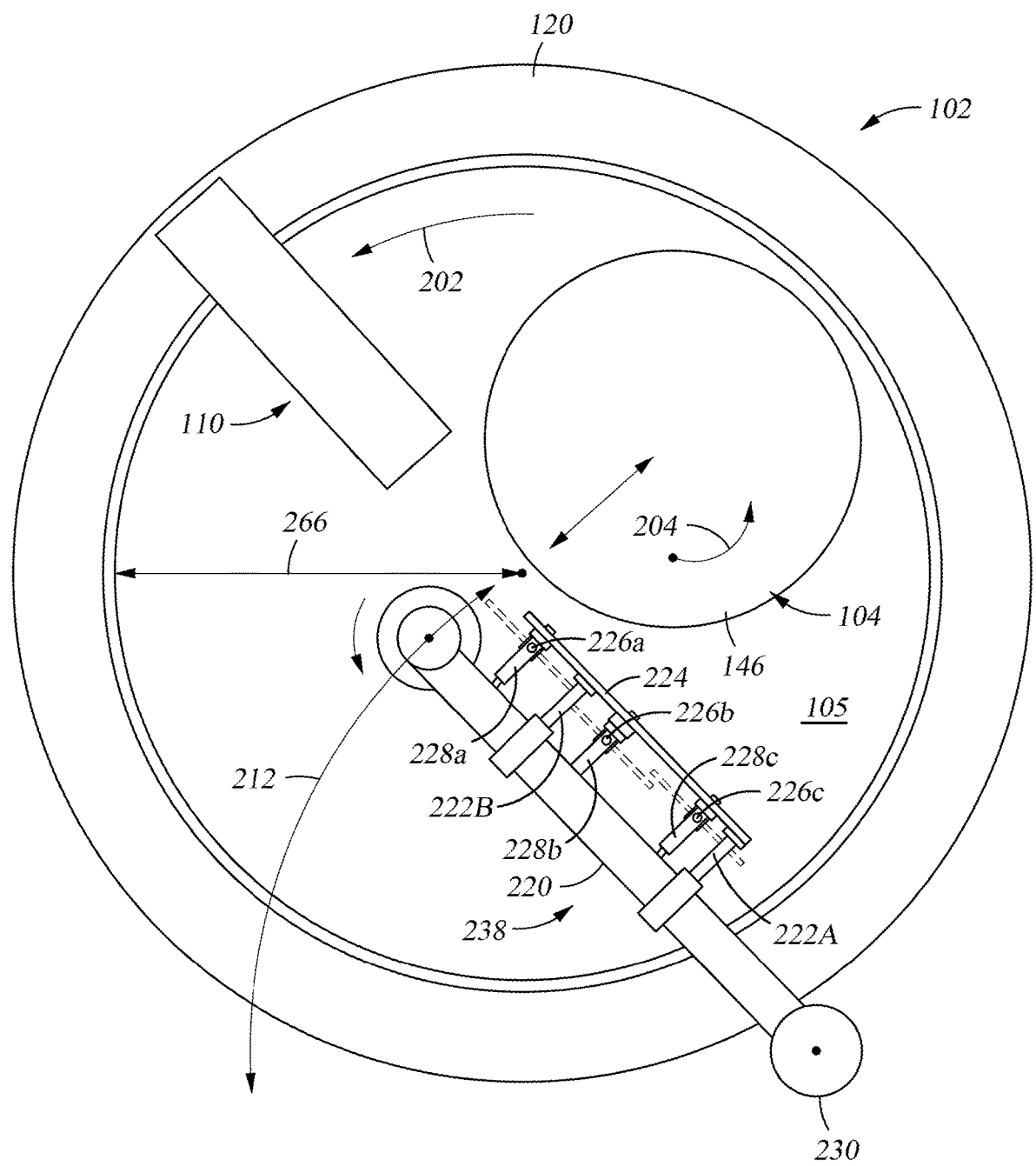
FIG. 2D is a schematic plan view of the polishing system, according to some embodiments.

FIG. 2C is a perspective view of the polishing system 100 of FIG. 2B (e.g., in the second position). Each nozzle 144a, 144b, 144c is configured to dispense a jet spray 236a, 236b, 236c, respectfully. Although FIGS. 2A-2C depict extender 222A to be shorter than extender 222B, other relative lengths are also contemplated. FIG. 2D depicts a schematic plan view of a polishing system with a pad conditioner, fluid delivery assembly 238 having extenders 222A, 222B with substantially the same length. The fluid nozzle plate 224 is substantially parallel to the movable arm 220.

Figure 3A:
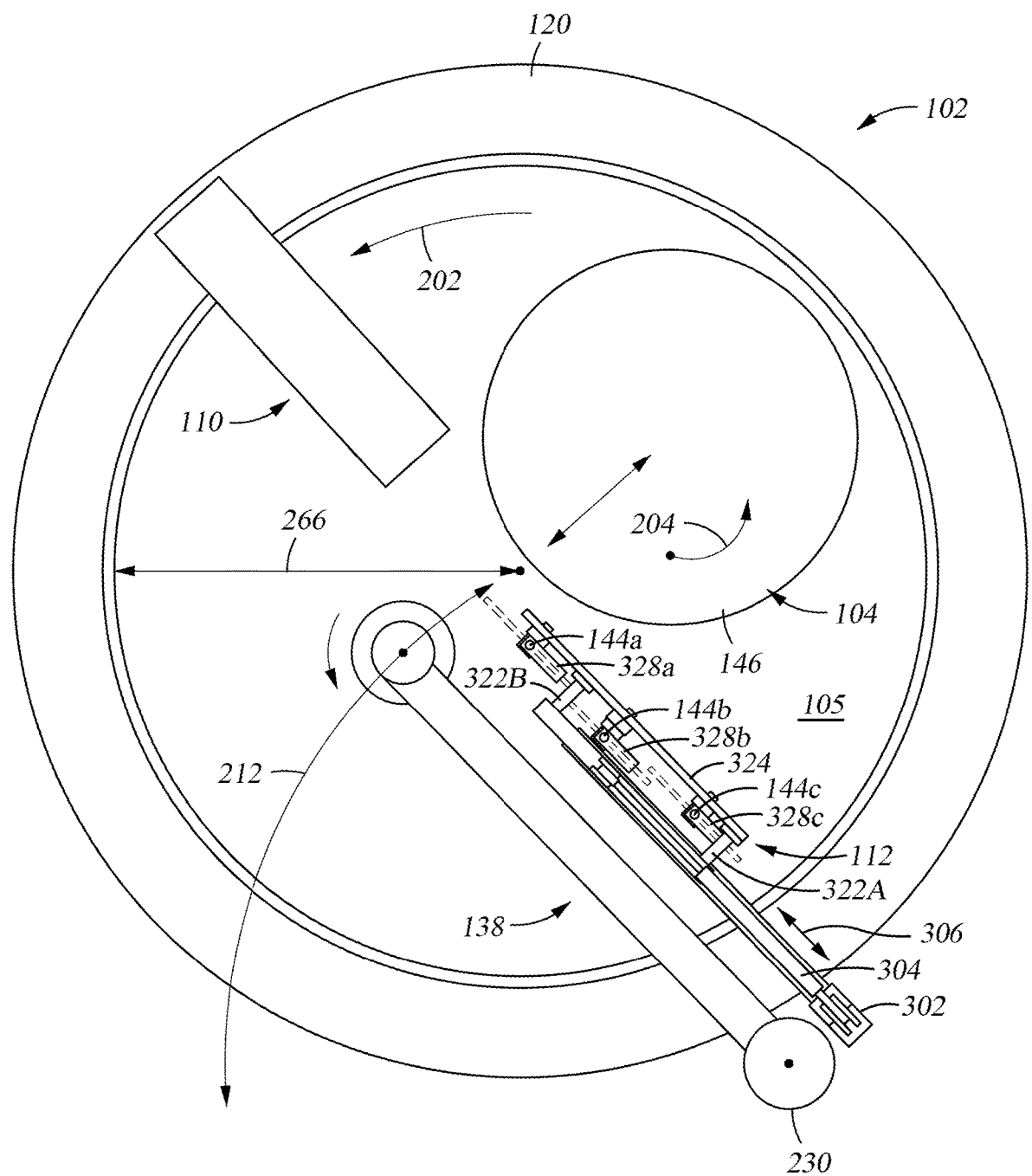
FIG. 3A is a schematic plan view of the polishing system, according to some embodiments.

FIG. 3A is a schematic plan view of the polishing system similar to the polishing system 100 and in which the fluid delivery assembly 112 is separate from the pad conditioner assembly 138, according to some embodiments. The fluid delivery assembly 112 includes a base 302 that is adjacent to the fulcrum 230 of the pad conditioner assembly 138. The base 302 is coupled to an actuator 304, such as a linear actuator. The actuator 304 is coupled to a fluid nozzle plate 324 at one or more locations (e.g., 322A, 322B). During operation, the actuator 304 is capable of moving along a path 306 from a retracted position to an extended position. The fluid nozzles 144a, 144b, 144c are sprayed in the extended position. In some embodiments, the fluid nozzles 144a, 144b, 144c are sprayed as the actuator moves between the retracted and the extended positions. The fluid nozzle plate 324 is similar to the fluid nozzle plate 224 depicted in FIGS. 2A-D and includes fast actuating valves 328a, 328b, 328c, such as solenoid valves. The fast actuating valves 328a, 328b, 328c, are substantially the same as the fast actuating valves 228a, 228b, 228c, except they are oriented parallel to the fluid nozzle plate 324 instead of perpendicular. Any orientation of fast actuating valves are also contemplated. In some embodiments, during operation, the fluid deliver assembly 112 is in a retracted position during conditioning with the pad conditioner assembly 138.

Figure 3B:
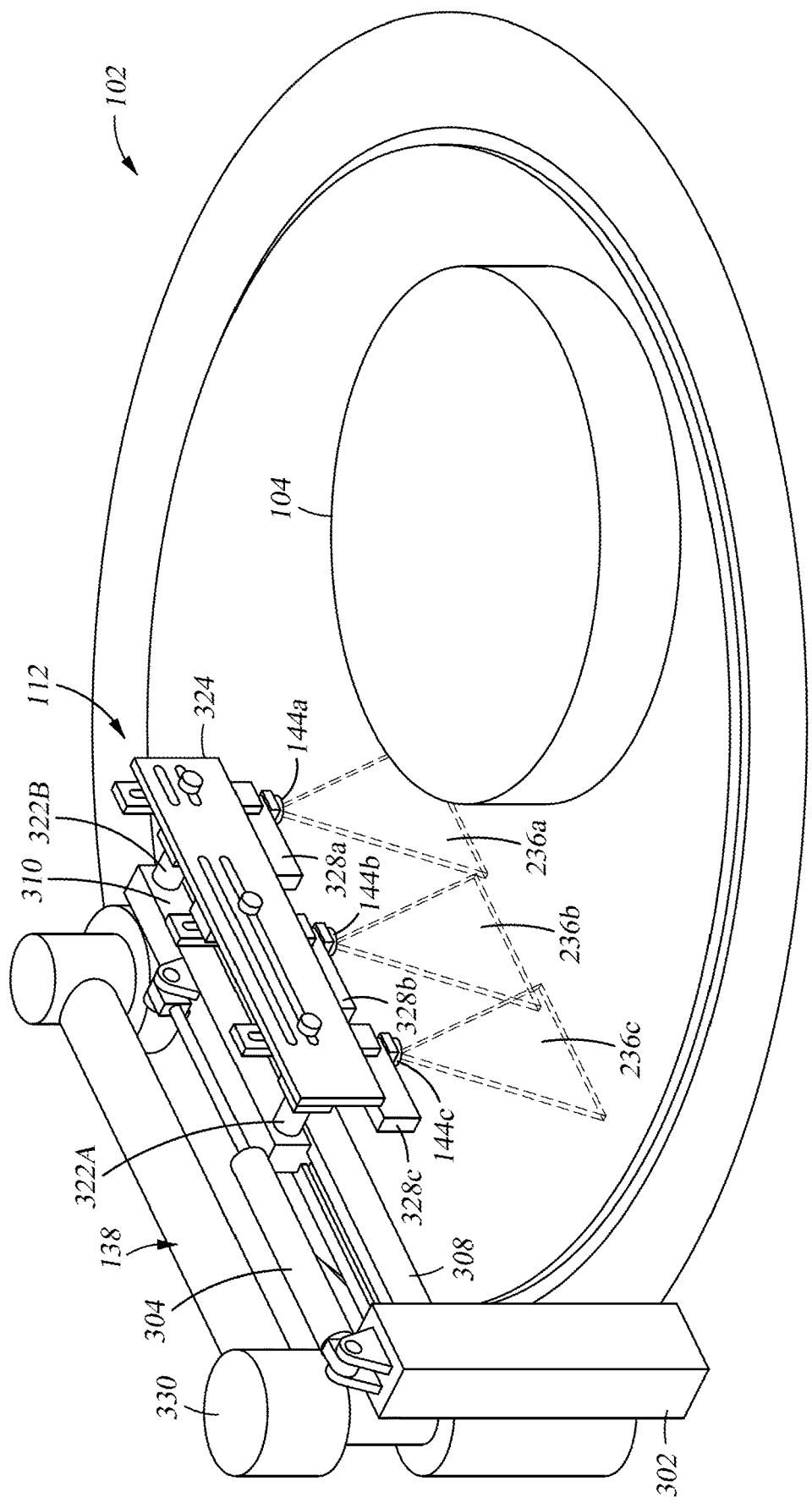
FIG. 3B is a perspective view of the polishing system, according to some embodiments.

FIG. 3B is a perspective view of the polishing system of FIG. 3A, according to some embodiments. The linear actuator 304 is shown coupled to a block 310 that is movable along a rail 308. The block 310 is coupled to the extenders 322A, 322B, which are coupled to the fluid nozzle plate 324. Although the fluid nozzle plate 324 is shown to be oriented perpendicular to the pad, other orientations and configurations are also contemplated. In some embodiments, the linear actuator 304 is coupled to a plate that is oriented parallel to the pad. The horizontally oriented plate is coupled directly to fluid nozzles 144a, 144b, 144c such that the fluid nozzles 144a, 144b, 144c are positioned between the fluid nozzle plate 324 and the pad. The extenders 322A, 322B are not used in the embodiment with the horizontally oriented plate. Although FIGS. 2A, 2B, 2C, 2D, 3A, and 3B depict fluid nozzles 144a, 144b, 144c on a side of the nozzle plate 224 that faces toward the arm 220, it is also contemplated for additional fluid nozzles, and/or for one or more of the fluid nozzles 144a, 144b, 144c to be disposed on the opposing side of the nozzle plate 224.

Figure 4:
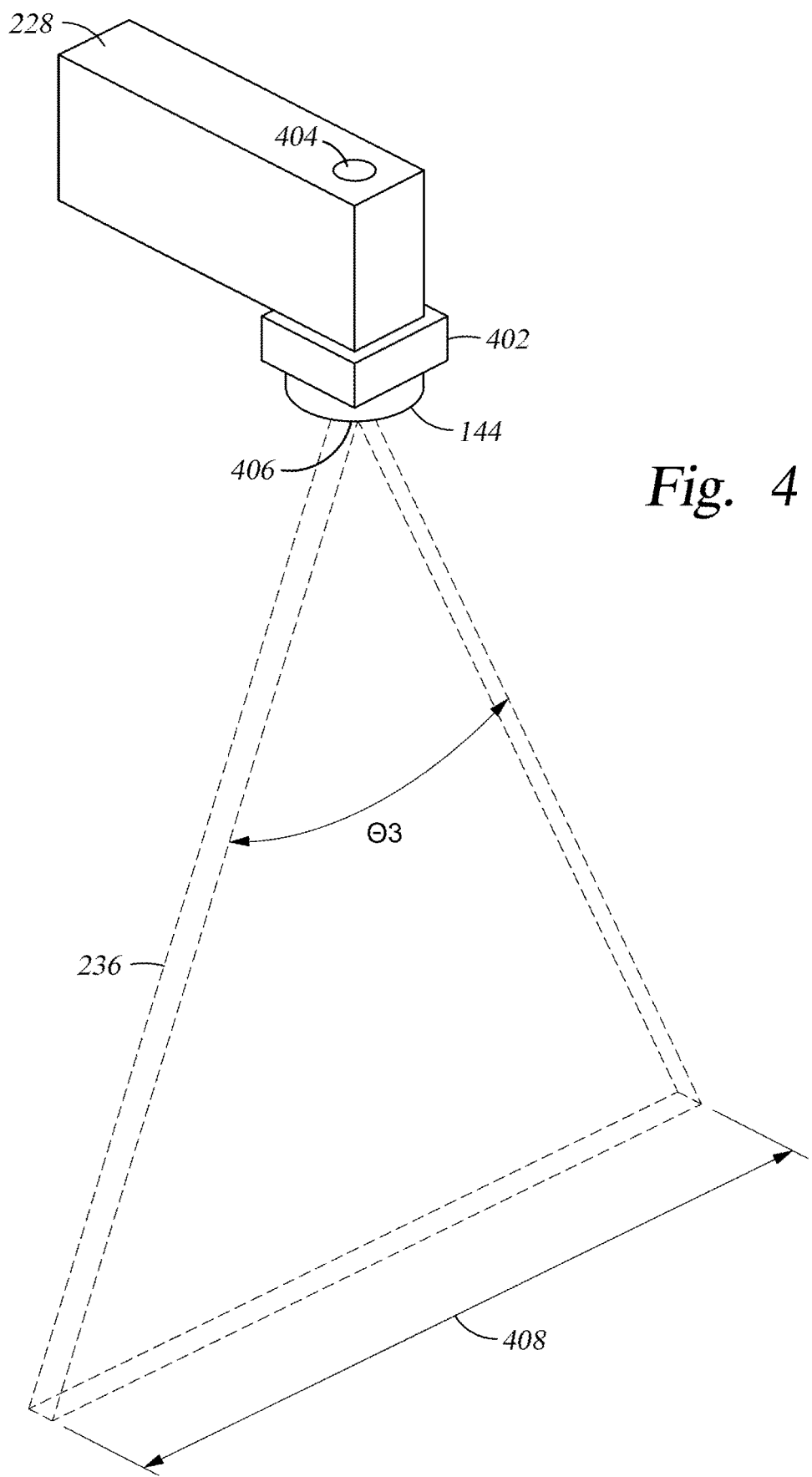
FIG. 4 is a cross sectional view of a nozzle and fast actuating valve, according to some embodiments.

FIG. 4 is a cross sectional view of a nozzle 144 and fast actuating valve 228, according to some embodiments. The jet spray 236 is a flat jet spray with an angle 83 of about 15 degrees to about 110 degrees, such as about 30 degrees to about 90 degrees, such as about 40 degrees to about 60 degrees. In some embodiments, each nozzle diameter is selected to control the flat jet spray angle 83. The nozzle diameters range from about 0.005 inches to about 0.2 inches, such as about 0.007 to about 0.15 inches. The jet sprays are arranged to cover different zones of the polishing pad 105 such as different radial positions of the pad radius 266. Each nozzle 144 is coupled to a corresponding fast actuating valve 228 by an adapter 402. An inlet 404 of the fast actuating valve receives fluid, such as polishing fluid and/or water. The fluid flows through adapter 402 and through nozzle 144 through outlet 406. Each nozzle 144 having an outlet 406 radius that is removable and capable of being exchanged with other nozzles having a different outlet radius depending on the type of polishing fluid and/or process. Although three nozzles are depicted in the figures, any number of nozzles are contemplated, such as 1 nozzle to 5 nozzles. The nozzle outlet 406 size is selected to produce a fan mist without changing a chemistry of the dispensing fluid. Selecting an outlet size that is too small results in changes in chemistry, such as a reduced percentage of nanomaterials (e.g., abrasives) suspended in the polishing medium. Additionally, an outlet size that is too small results in a mist that does not produce a desired jet pattern or a desired fluid pressure on the polishing pad 105. In some embodiments, the nozzles 144a, 144b, 144c are coupled with the fast actuating valves 228a, 228b, 228c such that the fluid only contacts non-corrosive surfaces from the slurry line to the outlet of each nozzle.

Figure 5:
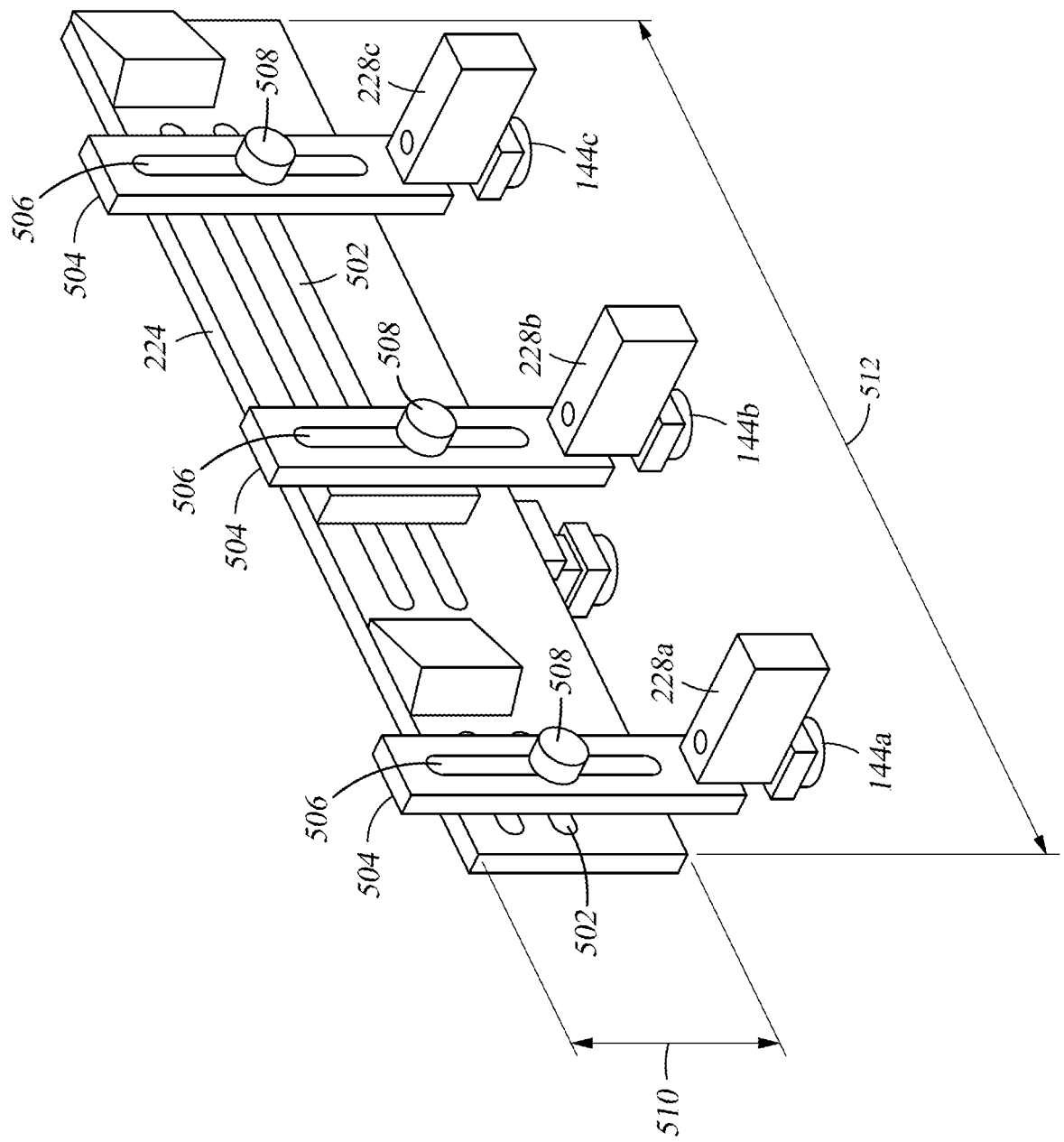
FIG. 5 is a plan view of a major surface of a fluid nozzle plate, according to some embodiments.

FIG. 5 is a plan view of a first major surface 224a of the fluid nozzle plate 224. The nozzle plate 224 includes one or more apertures 502 disposed therethrough from a first major surface to a second major surface of the nozzle plate 224. The apertures 502 are configured to receive fasteners 508 used to couple one or more adjustment plates 504 thereon. Each adjustment plate 504 includes apertures 506 therethrough to receive the fasteners 508. Each adjustment plate 504 is adjustable along a length 512 of the nozzle plate 224 and/or along a height 510 of the nozzle plate 224. Each adjustment plate 504 is coupled to corresponding fast actuating valves 228 and nozzles 144, such that a radial position of the nozzles 144 over the polishing pad 105 is adjustable and/or a distance between the pad and the nozzles are adjustable. A distance between the polishing pad 105 and a nozzle 144 is about 50 mm to about 80 mm, such as about 60 mm to about 70 mm. A Referring back to FIG. 4, a span 408 of a jet spray is controllable by changing a size of a nozzle outlet, and/or a distance from the nozzle to the polishing pad 105. In some embodiments, a span 408 of each adjacent spray jet is overlapped. A span 408 can be about 80 mm to about 130 mm, such as about 90 mm to about 100 mm, or about 110 mm to about 120 mm.

Figure 6:
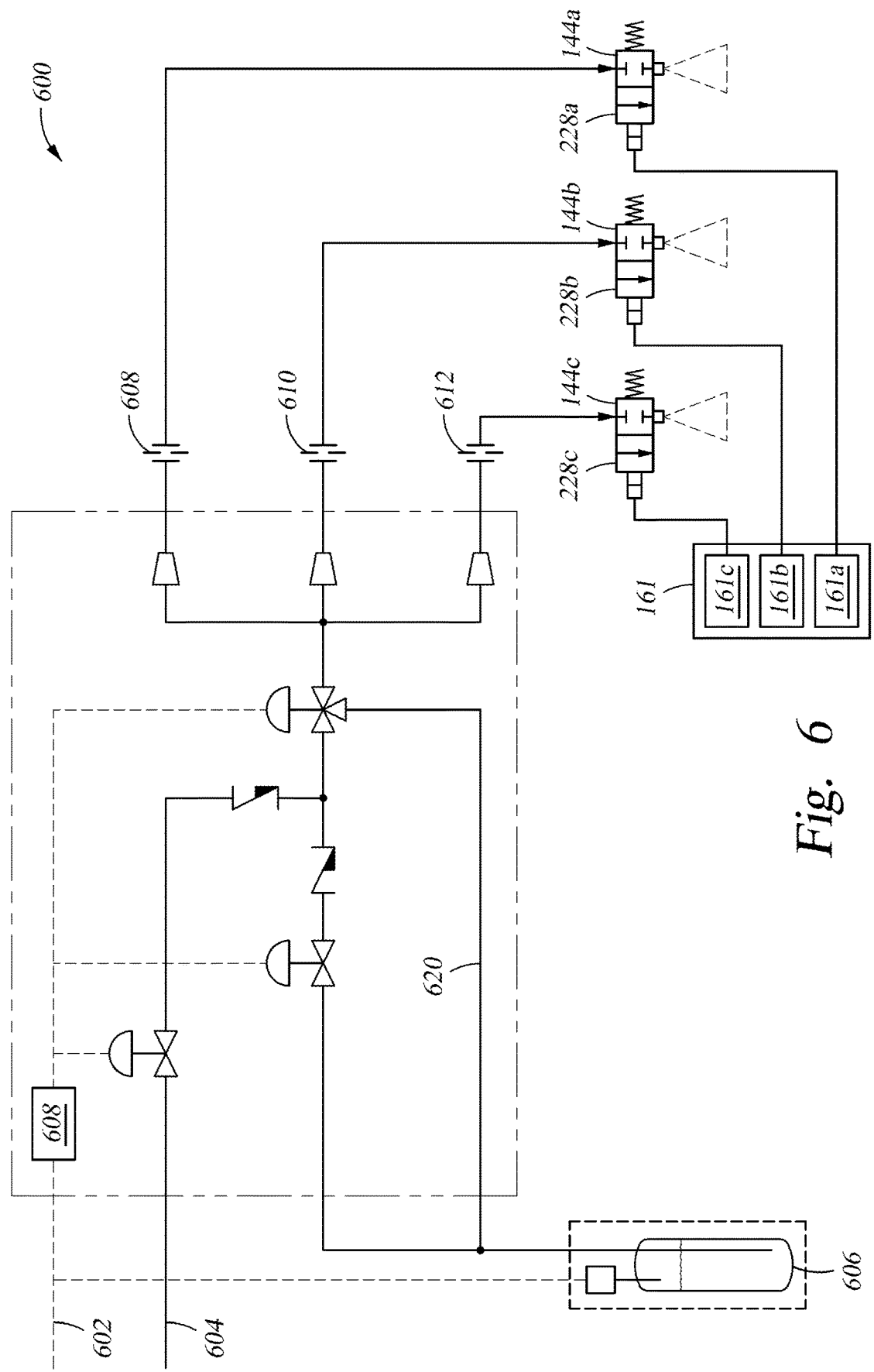
FIG. 6 is a schematic diagram of a fluid delivery system, according to some embodiments.
Figure 7:
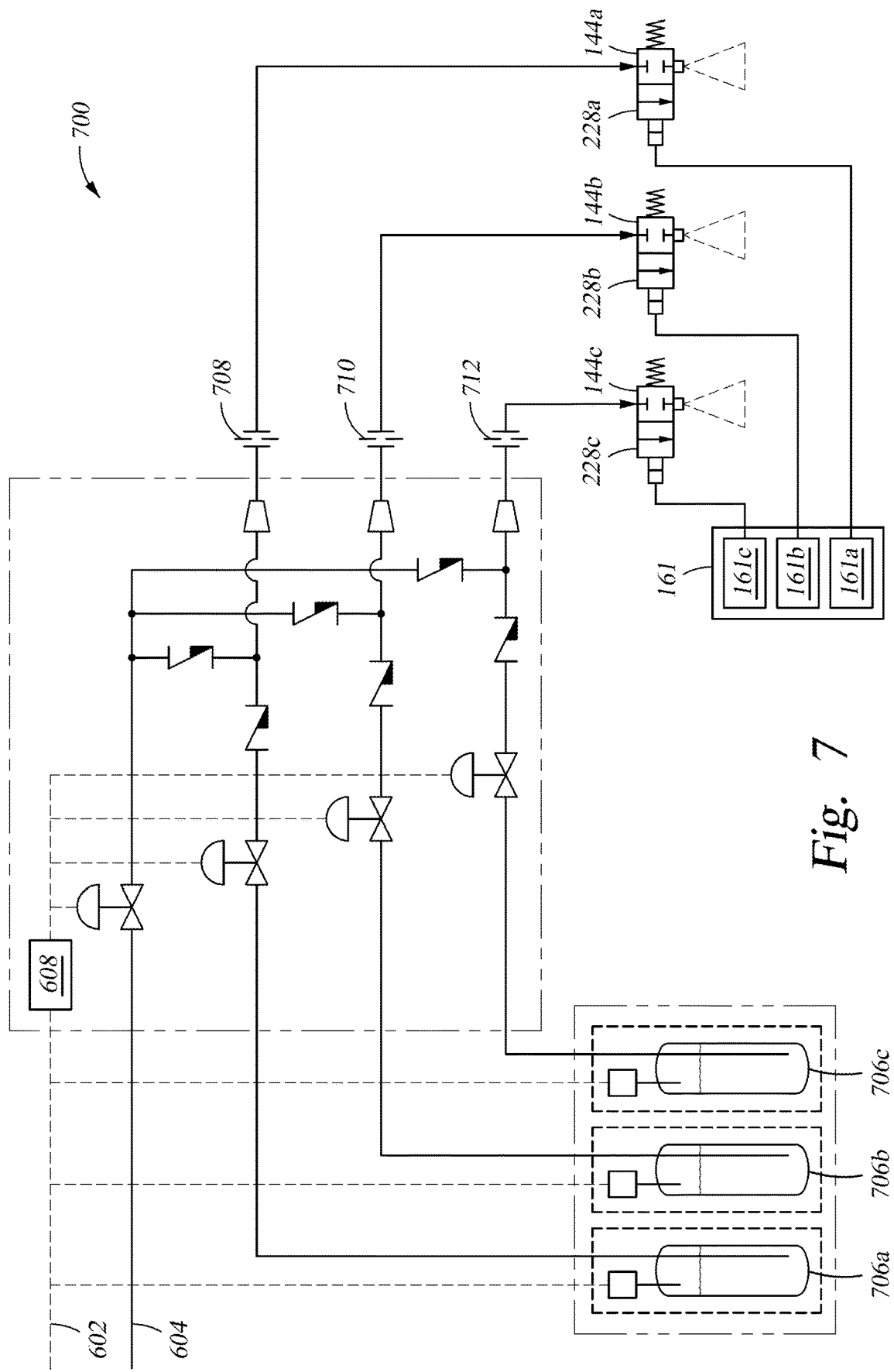
FIG. 7 is a schematic diagram of a fluid delivery system, according to some embodiments.

FIGS. 6 and 7 are schematic diagrams of example fluid delivery systems, according to some embodiments. Each of the fast actuating valves 228a, 228b, 228c (e.g., collectively 228) are fluidly coupled to a single polishing fluid supply vessel 606 as shown in fluid delivery system 600. Additionally, each of the fast actuating valves 228 are fluidly coupled a gas source 602 and/or a water source 604, such as a deionized water (DIW) source. The gas provided by the gas source 602 is clean dry air (CDA) or diatomic nitrogen and can be used to pressurize the polishing fluid supply vessel 606 to control a total liquid flow rate of the nozzles. In some embodiments, the gas from the gas source 602 is used to control a temperature of one or more fluids. The polishing fluid from the single polishing fluid supply vessel 606 is continuously cycled via recycle stream 620 to prevent settling of the polishing fluid within the lines. Each of the fast actuating valves 228 are communicatively coupled to corresponding PWM boards 161a, 161b, 161c, of a PWM panel 161. The PWM boards provide open and close signals to corresponding fast actuating valves 228 such that each valve open and close at a predetermined frequency per revolution of the polishing pad 105 and a predetermined duty cycle which is a percentage of the polishing pad 105 exposed to fluid per rotation of the polishing pad 105. The PWM boards are communicatively coupled to flow meters 608, 610, 612 which monitor the flow across each line upstream of inlets of each valve 144a, 144c, 144d. The term "upstream" as used herein, is relative to a flow direction of fluids.

In fluid delivery system 700, each of the fast actuating valves 228 are fluidly coupled to corresponding polishing fluid supply vessels 706a, 706b, 706c. The gas provided by the gas source 602 is diatomic nitrogen or clean dry air and can be used to pressurize each polishing fluid supply vessels 706a, 706b, 706c to control a liquid flow rate for each corresponding fast actuating valve 228. The PWM boards of PWM panel 161 are communicatively coupled to flow meters 708, 710, 712 which monitor the flow across each line upstream of inlets of each valve 144a, 144c, 144d.

Figure 8:
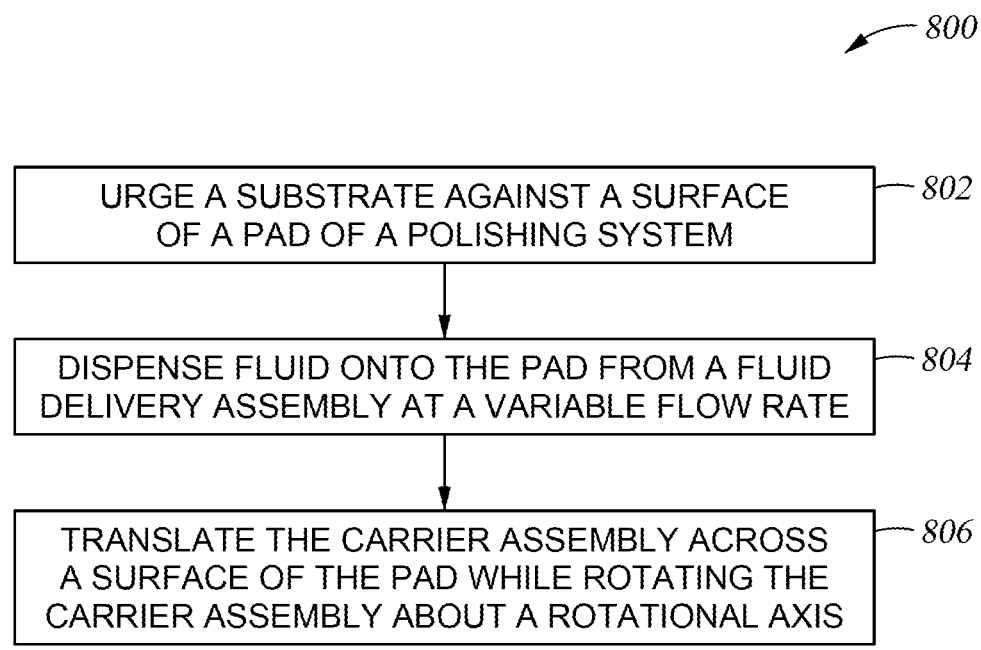
FIG. 8 is a flow diagram of a method of polishing a substrate, according to some embodiments.

FIG. 8 is a flow diagram of a method 800 of polishing a substrate in accordance with some aspects of the present disclosure. The method 800 includes urging 802 a substrate against a surface of a polishing pad 105 of a polishing system, dispensing 804 a fluid onto the polishing pad 105 from a fluid delivery assembly at a variable flow rate, and translating 806 the carrier assembly across a surface of the polishing pad 105 while rotating the carrier assembly about a rotational axis. Dispensing 804 the fluid includes dispensing the fluid from one or more nozzles at a first flow rate of the variable flow rate. The first flow rate corresponds to an OPEN position of a fast actuating valve at a frequency and a duty cycle. Each nozzle dispenses fluid at zones which correspond to radial positions over a polishing pad 105 disposed below the nozzles. Dispensing 804 the fluid includes setting a duty cycle to 100% for at least one nozzle for least one pad rotation for DIW purge or to get a continuous flow for priming the polishing pad with polishing fluid. The duty cycle is reduced for least one nozzle to a duty cycle less than 100%. The duty cycle for each nozzle is set to about 10% to about 90%, such as about 25% to about 75%, such as about 50% to about 60%. Dispensing further includes setting a frequency of pulsing the fluid. In some embodiments, one or more of the nozzles 144a, 144b, 144c are purged with DIW to prevent the nozzles from clogging.

Figure 9:
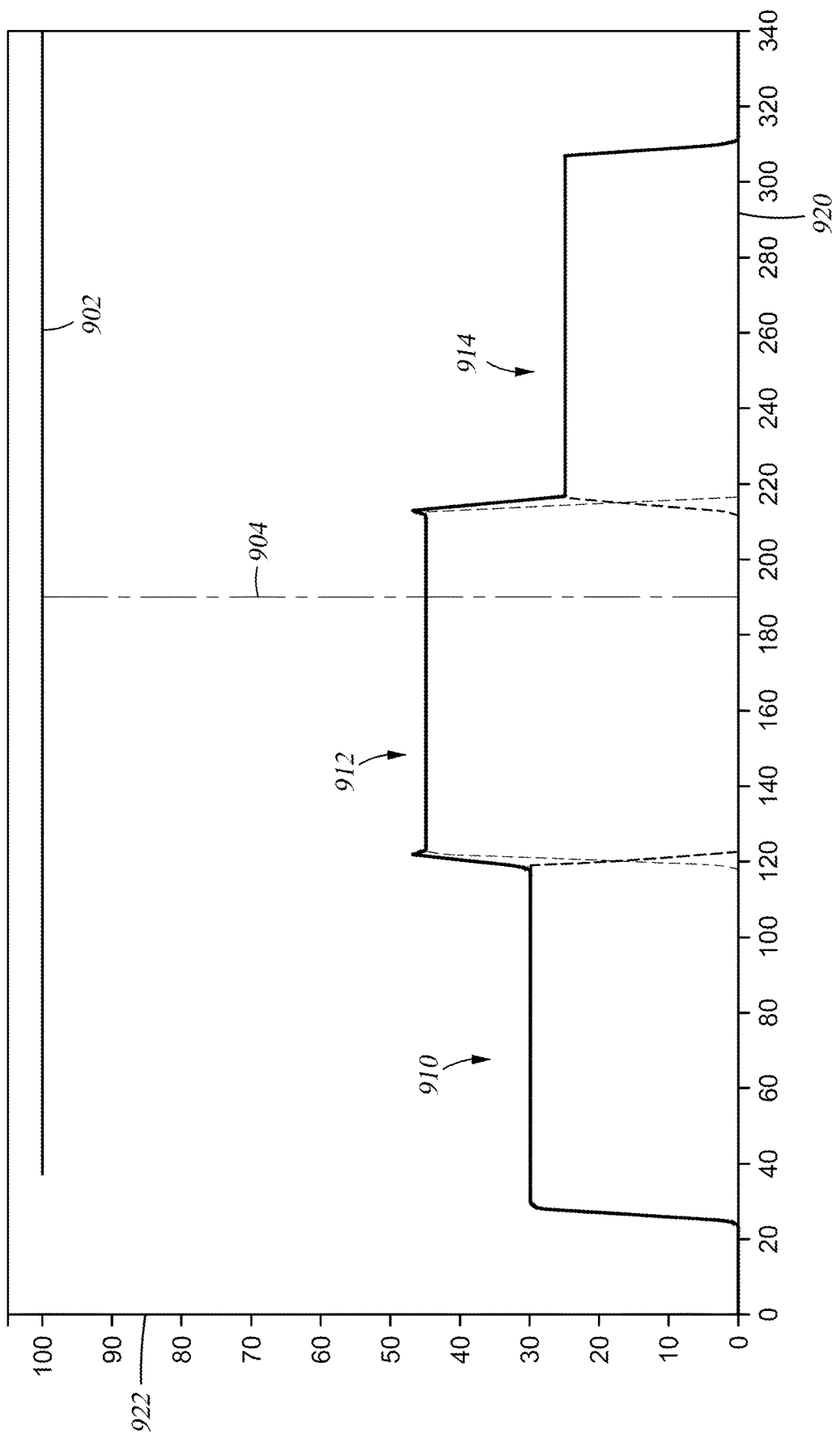
FIG. 9 depicts an example spray zone profile across the polishing pad, according to some embodiments.

FIG. 9 depicts an example spray zone profile across the polishing pad 105, in accordance with some embodiments. The horizontal axis 920 corresponds to a position of the polishing pad 105 from center to outer edge of the polishing pad 105 that is exposed to corresponding jet sprays of the one or more nozzles, and the vertical axis 922 corresponds to a flow rate distribution of jet spray, such as in mL per minute. Each zone corresponds to a radial portion of a substrate carrier assembly 104 that passes over the zone. A substrate diameter 902 and a substrate center 904 is depicted to illustrate the zone profile corresponding to a substrate that passes over the zone after spraying. Each zone, such as inner zone 910, middle zone 912, and outer zone 914 is controllable depending on the process. A first nozzle corresponding to the inner zone 910 can be about 70 mm to about 80 mm from pad center, a second nozzle corresponding to the middle zone 912 can be about 160 mm to about 180 mm from pad center, and a third nozzle corresponding to the outer zone 914 can be about 250 to about 270 mm from pad center. The example distribution shown in FIG. 9 depicts a total flow rate of 100 mL per minute divided among inner 910, middle 912, and outer zones 914. The zones having a flow distribution of about 30 mL/min in the inner zone 910, 45 mL/min in the middle zone 912, and 25 mL/min in the outer zone.

In some embodiments, the outer zone corresponds to a nozzle having a larger or smaller outlet diameter relative to at least one other nozzle. In some embodiments, the inner zone corresponds to a nozzle having a smaller or larger outlet diameter relative to at least one other nozzle. In some embodiments, the outer zone corresponds to a nozzle having a higher or lower flow rate relative to at least one other zone. Without being bound by theory, it is believed that more fluid is lost at zones disposed radially outward relative to other zones because the fluid is quickly run off of the polishing pad 105 due to centrifugal forces. Traditionally, in order to account for fluid loss, a total polishing fluid dispensed is increased. In contrast, the polishing system and method described herein, enables increasing polishing fluid flow at targeted zones, such as increasing a fluid flow rate at a nozzle disposed in the outer zone 914. Increasing one zone can be displaced by decreasing other zones such that a total flow rate is not affected.

Process parameters for controlling one or more zones include adjusting platen speed, total flow rate, substrate center position, flow rate ratios across zones, polishing fluid supply vessel pressure, spray jet span, spray jet angle, duration of valve in open position, duty cycle, frequency, distance between nozzle and polishing pad, position of each nozzle relative to radius of pad, or a combination thereof. Fluid flow rate ratios across the nozzles are determined based on the variable flow rate of each nozzle relative to one another. Each nozzle dispenses at corresponding zones of the pad to form a spray profile. The profile is formed by adjusting a flow rate ratio of fluid dispensed on each zone. The platen speed includes rotating the platen at about 70 rpm to about 120 rpm, such as about 80 rpm to about 100 rpm. In some embodiments, each zone has a duty cycle of about 20% to about 70%, such as about 30% to about 50%. In some embodiments, each nozzle has a frequency of about 10 Hz to about 40 Hz, such as about 15 Hz to about 30 Hz.

Figure 10:
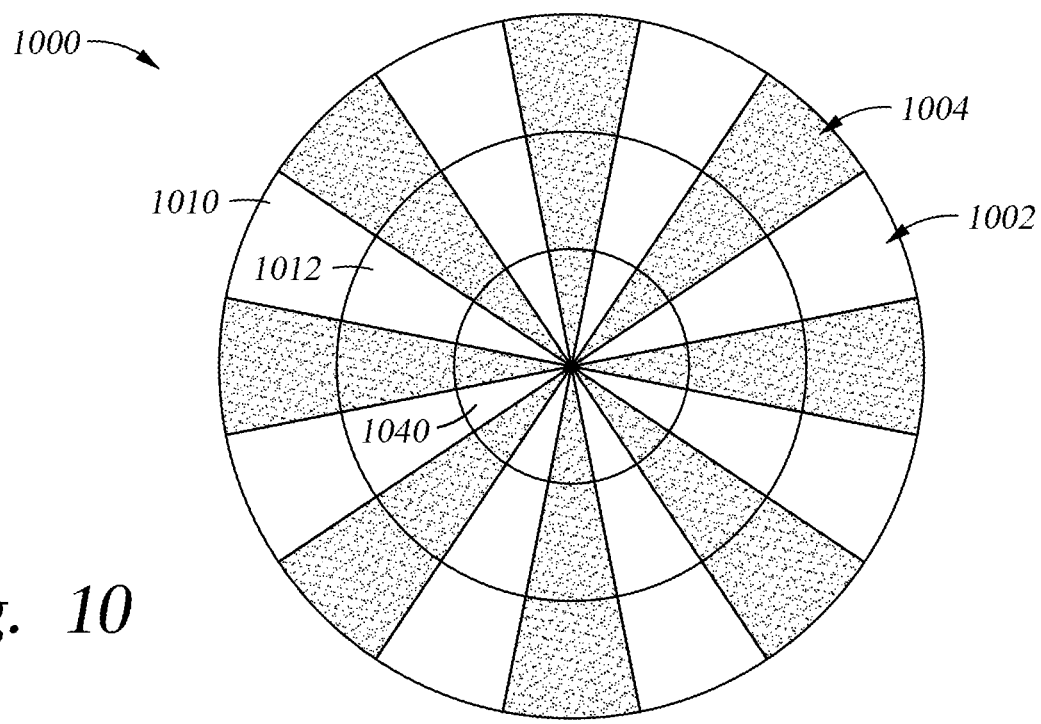
FIG. 10 is a schematic top view of a spray pattern on a polishing pad according to some embodiments.
Figure 11:
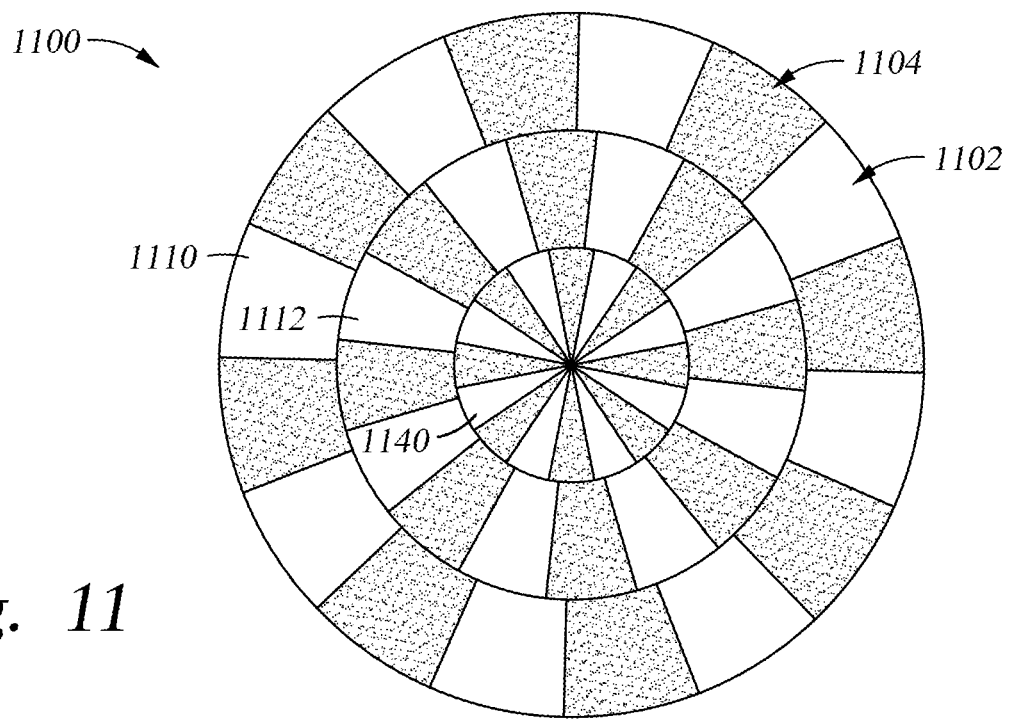
FIG. 11 is a schematic top view of a spray pattern on a polishing pad according to some embodiments.

FIG. 10 is a schematic top view of a spray pattern 1000 on a polishing pad 105. Spray portions 1004 illustrate portions of the polishing pad 105 exposed to fluid in a single rotation of a platen. Corresponding portions 1002 illustrate portions of the polishing pad 105 that are not exposed to the fluid. Subsequent spray patterns after additional rotations can complement or at least overlap the pattern 1000 depicted in FIG. 10. Each nozzle can have the same spray patterns such that inner zone 1040, middle zone 1012, and outer zone 1010 are aligned, as shown in FIG. 10. Alternatively, each nozzle can have different spray patterns such that the zones are not aligned as shown in FIG. 11. Spray portions 1104 depict portions of the polishing pad 105 exposed to fluid in a single rotation of a platen. Corresponding portions 1102 illustrate portions of the polishing pad 105 that are not exposed to the fluid. Spray pattern 1100 shows different spray patterns in the inner zone 1140, middle zone 1112, and inner zone 1110. Other spray patterns are also contemplated, such as different number of sprays (e.g., frequency) and different spray durations and pad coverage (e.g., duty cycle). In the spray pattern 1000 depicted in FIG. 10, the nozzle is sprayed 8 times, however other number of sprays per rotation is contemplated, such as 2 times to 5 times, or 10 times to 15 times, or 20 times to 25 times.

It has been discovered that the fluid delivery system and methods described herein extends a life of the polishing pad by uniformly distributing fluids over the pad. Conventional fluid delivery systems dispense fluids at a single location on the pad which creates high friction and elevated temperatures at other locations of the pad, such as proximate to the center of the pad. Overtime, pads used with conventional fluid delivery systems wear over time and are replaced at a certain frequency. Pads used with the fluid delivery system and methods described herein experience less friction and wear and are replaced a lower frequency relative to conventional systems and methods.

What is claimed is:

1. A method of polishing a substrate, comprising:
   urging a substrate against a surface of a pad of a polishing system using a carrier assembly;
   dispensing fluid from one or more nozzles to one or more radial positions above the pad from a fluid delivery assembly at a variable flow rate, wherein a first flow rate of the variable flow rate is pulsed at a frequency and a duty cycle, wherein
      the frequency is a number of pulses of the fluid at the first flow rate per rotation of the pad and the duty cycle is a percentage of the pad exposed to fluid per rotation of the pad,
   dispensing the fluid further comprises:
      setting a duty cycle to 100% for the at least one nozzle for at least one pad rotation,
      reducing the duty cycle for the at least one nozzle, and
      setting a frequency and at least one flow rate for at least one nozzle; and
   translating the carrier assembly across a surface of the pad while rotating the carrier assembly about a rotational axis.

2. The method of claim 1, further comprising controlling each dispensing nozzle to dispense at corresponding variable flow rates, wherein controlling each variable flow rate comprises turning on and off each nozzle at corresponding frequency and duty cycle.

3. The method of claim 1, wherein the fluid is dispensed on the pad proximate to a leading edge of a translational path of the carrier assembly.

4. The method of claim 1, wherein dispensing the fluid further comprises dispensing the fluid from a single fluid supply vessel, wherein the fluid is split to each of the nozzles.

5. The method of claim 1, wherein each nozzle dispenses at corresponding zones of the pad, wherein a spray profile of fluid dispensed on each zone is controlled by adjusting a fluid flow ratio across the nozzles, wherein the fluid flow ratio is determined based on the variable flow rate of each nozzle relative to one another.

6. The method of claim 1, wherein a duty cycle of each nozzle is about 25% to about 80%.

7. The method of claim 1, wherein dispensing the fluid comprises dispensing fluid from each nozzle at corresponding fan jets, wherein each fan jet comprises edge to edge angles, wherein each angle is about 15 degrees to about 110 degrees.

8. The method of claim 1, wherein dispensing the fluid further comprises dispensing different fluids from different fluid supply vessels.

9. The method of claim 1, wherein the fluid delivery assembly further comprises an arm and a plate coupled to the arm, the plate comprises the one or more nozzles and one or more valves coupled to the one or more nozzles.

10. The method of claim 9, wherein the each of the one or more valves corresponds to one of the one or more nozzles.

11. The method of claim 9, further comprising an actuator coupled to the arm and configured to translate the fluid delivery assembly between a retracted and an extended position.

12. The method of claim 1, wherein the dispensing of the fluid further comprises dispensing the fluid on the pad a distance from an edge of the carrier assembly.

13. The method of claim 1, wherein the dispensing of the fluid further comprises dispensing a fluid that has a temperature less than the temperature of the pad.

14. The method of claim 1, wherein the one or more nozzles comprise a first nozzle configured to dispense a fluid to an inward zone and a second nozzle configured to dispense a fluid to an outward zone, the inward zone and the outward zone are different radial zones along the pad radius.

15. The method of claim 1, wherein the fluid delivery assembly further comprises an arm and a plate coupled to the arm, the plate comprises the one or more nozzles and one or more valves coupled to the one or more nozzles, the one or more nozzles are fan jet nozzles coupled to the plate and configured to dispense the fluid having a flat fan jet shape, wherein the fluid is pressurized.

16. The method of claim 1, wherein the fluid delivery assembly comprises at least two nozzles, each nozzle comprising corresponding outlet sizes, wherein each nozzle outlet size is different from at least one other nozzle.

17. A method of polishing a substrate, comprising:
urging a substrate against a surface of a pad of a polishing system using a carrier assembly;
dispensing fluid from one or more nozzles at corresponding radial positions above the pad from a fluid delivery assembly at a variable flow rate, wherein a first flow rate of the variable flow rate is pulsed at a frequency and a duty cycle, wherein
the frequency is a number of pulses of the fluid at the first flow rate per rotation of the pad,
the duty cycle is a percentage of the pad exposed to fluid per rotation of the pad,
the frequency of each nozzle is about 10 Hz to about 40 Hz, the duty cycle of about 25% to about 80%; and
translating the carrier assembly across a surface of the pad while rotating the carrier assembly about a rotational axis.

18. The method of claim 16, wherein each of the one or more nozzles are coupled to a corresponding valve.

19. A method of polishing a substrate, comprising:
urging a substrate against a surface of a pad of a polishing system using a carrier assembly;
dispensing fluid at corresponding radial positions above the pad from a fluid delivery assembly at a variable flow rate, the fluid delivery assembly comprising:
an arm;
a plate coupled to the arm;
one or more nozzles, each nozzle coupled to a portion of the plate and configured to dispense a pressurized fluid having a flat fan jet shape to one or more zones on the pad; and
one or more valves coupled to a corresponding nozzle of the one more nozzles, wherein a first flow rate of the variable flow rate is pulsed at a frequency and a duty cycle, wherein the frequency is a number of pulses of the fluid at the first flow rate per rotation of the pad and the duty cycle is a percentage of the pad exposed to fluid per rotation of the pad, the frequency of each nozzle is about 10 Hz to about 40 Hz, the duty cycle of about 25% to about 80%; and
translating the carrier assembly across a surface of the pad while rotating the carrier assembly about a rotational axis.

* * * * *